United States Patent [19]

McEwan et al.

[11] Patent Number: 5,036,248

[45] Date of Patent: Jul. 30, 1991

[54] LIGHT EMITTING DIODE CLUSTERS FOR DISPLAY SIGNS

[75] Inventors: Vince McEwan, Kettlby; Milan Patel, Concord, both of Canada

[73] Assignee: Ledstar Inc.

[21] Appl. No.: 610,309

[22] Filed: Nov. 8, 1990

Related U.S. Application Data

[63] Continuation of Ser. No. 331,390, Mar. 31, 1989, abandoned.

[51] Int. Cl.[5] .................. H01L 33/00

[52] U.S. Cl. .................. 313/500; 313/51; 313/110; 313/318; 362/800; 362/812; 40/452

[58] Field of Search .................. 313/500, 499, 110, 111, 313/318, 51; 362/359, 800, 812; 40/452, 550; 340/782

[56] References Cited

U.S. PATENT DOCUMENTS

| | | | |
|---|---|---|---|
| 4,254,453 | 3/1981 | Mouyard et al. | 340/782 X |
| 4,271,408 | 6/1981 | Teshima et al. | 362/800 X |
| 4,277,819 | 7/1981 | Sobota et al. | 362/800 X |
| 4,628,422 | 12/1986 | Ewald | 362/812 X |
| 4,733,335 | 3/1988 | Serizawa et al. | 362/800 X |
| 4,847,531 | 7/1989 | Tsuji et al. | 313/318 |
| 4,851,824 | 7/1989 | Murata | 340/782 X |

FOREIGN PATENT DOCUMENTS

| | | | |
|---|---|---|---|
| 2814877 | 10/1979 | Fed. Rep. of Germany | 362/800 |
| 3342925 | 6/1985 | Fed. Rep. of Germany | 362/359 |
| 2579349 | 9/1986 | France | 340/782 |

*Primary Examiner*—Palmer C. DeMeo
*Attorney, Agent, or Firm*—Bacon & Thomas

[57] ABSTRACT

The invention concerns light emitting diode clusters assembly suitable for use in outdoor displays. The cluster on a circuit board is housed in a first socket open to its front and nested in an outer connector socket. Electrical wiring runs from the rear of the first socket via the connector socket to a source of electricity. The connector socket provides weather proofing and protects the circuit board from torque. Moreover, driver circuits of a display board into which the assembly is connected may be shielded from ultraviolet rays. A tubular visor may be provided to the front.

7 Claims, 3 Drawing Sheets

LIGHT EMITTING DIODE CLUSTERS FOR DISPLAY SIGNS

This application is a continuation of U.S. Ser. No. 07/331,390, filed Mar. 31, 1989, now abandoned.

BACKGROUND OF THE INVENTION

1. Field of the Invention

The invention relates to a light emitting diode cluster unit comprising an array of light emitting diodes and suitable for use in display signs such as those used on highways to display information to motorists.

2. Prior Art

Display signs used for advertising or for displaying direction or other information to motorists have an important feature in common. They should be eye-catching and their information should be easy to absorb. This is especially true of signs to be located on the highway where the motorist may be moving fast and may need to absorb the information quiCkly.

Such display signs have traditionally used fluorescent or incandescent lamps which are expensive in electricity and may need frequent maintenance and repair. Each lamp usually forms an appreciable part of any letter in a display of information, and so, if any one lamp becomes non-functional it has an appreciable effect on decipherability and as more lamps become non-functional it may be considerably more difficult to decipher the letter.

U.S. Pat. No. 4,727,289, issued 23rd Feb., 1988 to Akio and assigned to Stanley Electric Co. Ltd., discloses a lamp comprising a plurality of high-emitting diodes LEDs on a printed circuit board and arranged inside a glass bulb. Current is supplied to the LED through a series resistor having an annular shape and fitted around the stem of the lamp. Lamps according to that patent may be used for displays while providing advantages such as:

1. the provision of a very large number of discrete light sources (LEDs). If only a few of the LEDs fail, there will be little visual deterioration to the display, 2. by suitable selection of the LEDs, the colour of the display or parts of the display is easily adjustable without the use of tinted glass or other filters, and 3. a considerable saving in energy cost.

However, it might be desirable to reduce the expense of manufacture of such LED arrays within conventional glass bulbs. Moreover, when used for displays, the glass bulb itself may produce some glare and reflection of, example, sunlight, thus tending to confuse the display. Also the reliability of the connector socket may not be high due to the fact that the contacts are not environmentally sealed and are therefore susceptable to corrosion. Corrosion in the socket may make it difficult to replace the bulb especially in harsh environments such as highways.

SUMMARY OF THE INVENTION

According to the present invention, there is provided a light emitting diode cluster unit for outdoor use comprising: a connector socket for direct connection into an electric outlet, the connection socket being provided with first electric contacts within the socket and electric connection means through a rear wall and adapted for connection into said outlet; a housing for a cluster of light emitting diodes slidably nested within said connector socket and being an open fronted socket having electrical connection means extending through a rear wall to second electric contacts adapted to connect said first electric contacts of said connection socket, the light emitting diodes being positioned on a circuit board and embedded in potting compound within the housing socket light emitting domes of the light emitting diodes projecting from a front surface of the potting compound, a connector socket for said housing for connection into an electrically operated display. Preferably, a generally tubular visor is provided extending forwardly of the light emitting diode cluster. The invention also provides a display sign incorporating a light emitting diode unit according to the invention.

BRIEF DESCRIPTION OF THE DRAWINGS

Embodiments of the invention will now be described by way of example with reference to the drawings in which.

DESCRIPTION OF THE PREFERRED EMBODIMENT

An LED unit 10 for outdoor use comprises a three-part structure of an LED cluster member 14 resting in a connector socket member 16, which itself fits, on the one hand, into one end of a tubular visor member 12 and, on the other hand, is provided with means for direct connection into a display sign.

Figure 1:
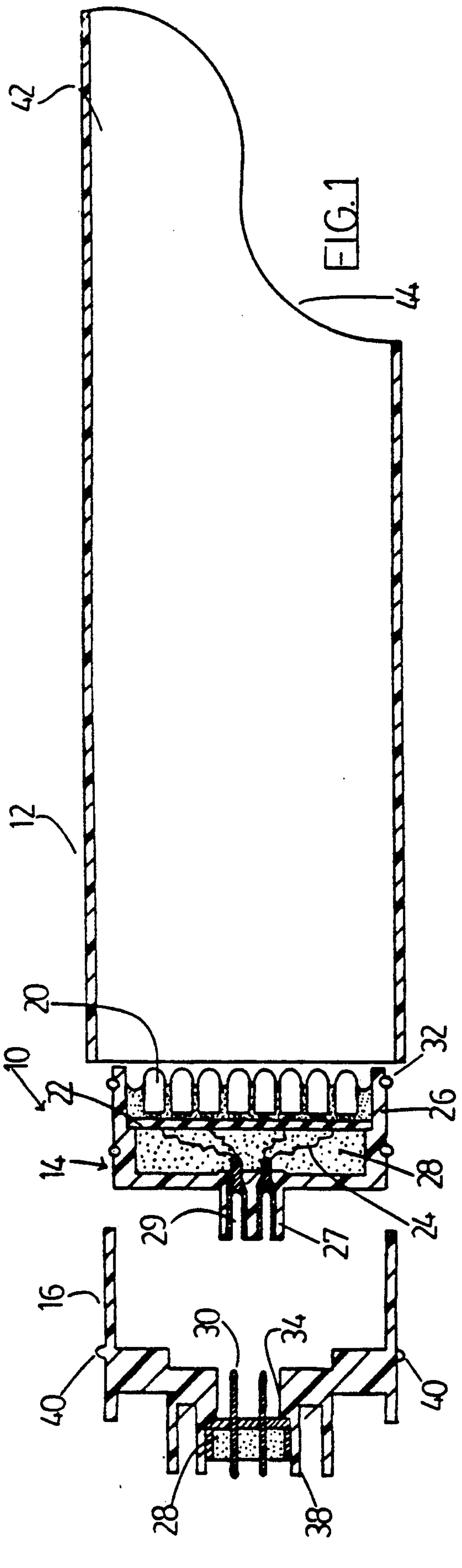
FIG. 1 is a view mainly in section of a disassembled LED unit according to an embodiment of the invention.
Figure 2:
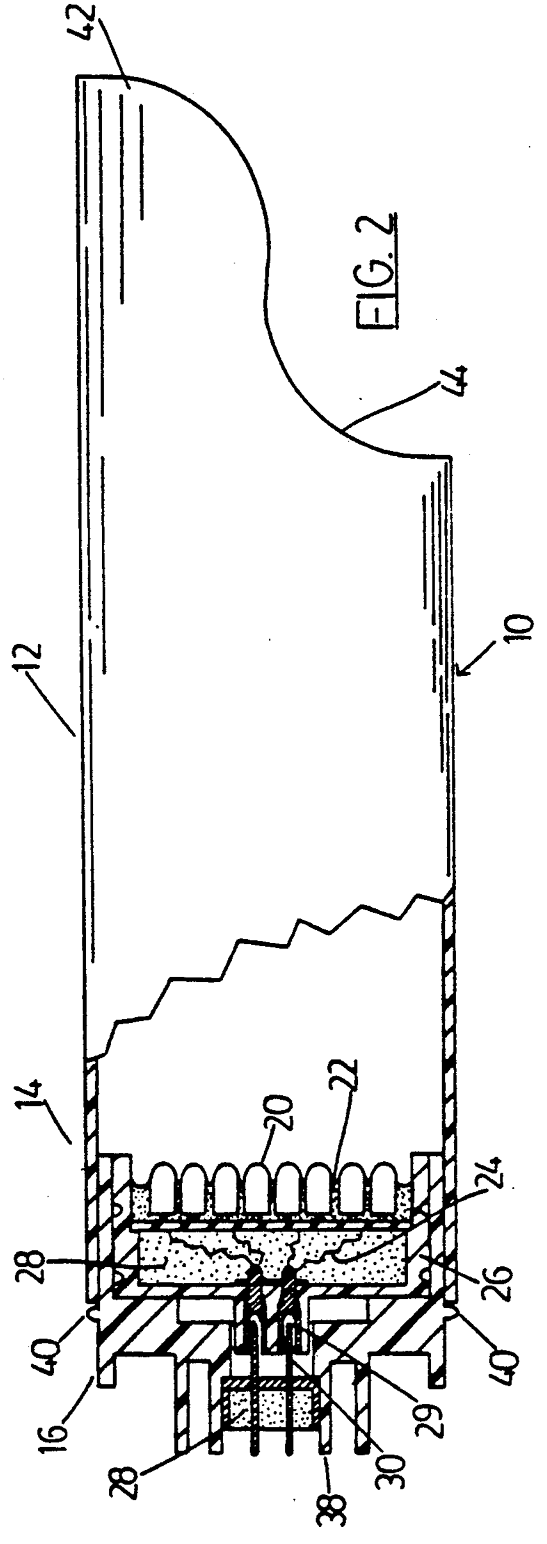
FIG. 2 is a view similar to that of FIG. 1 with the unit assembled.
Figure 3:
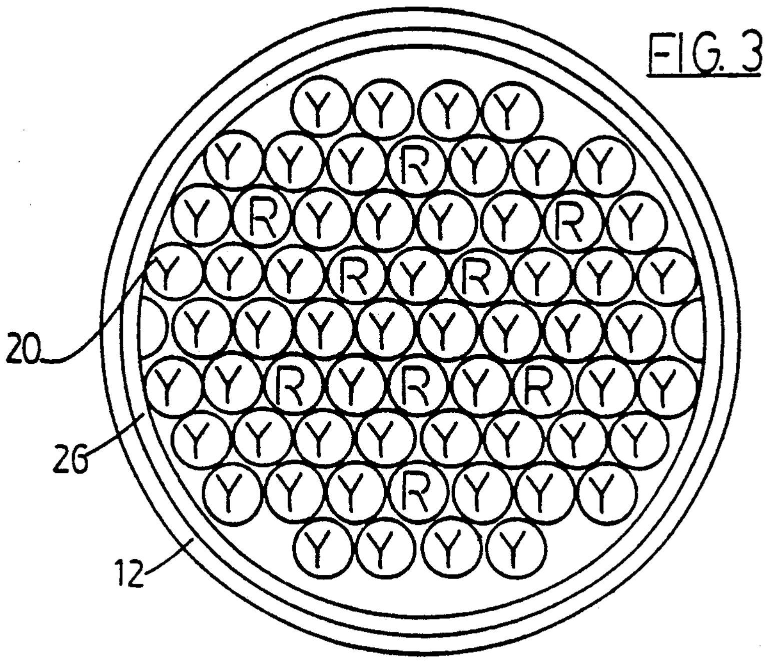
FIG. 3 is a sketch showing one pattern of red and yellow LEDs in a unit.
Figure 4:
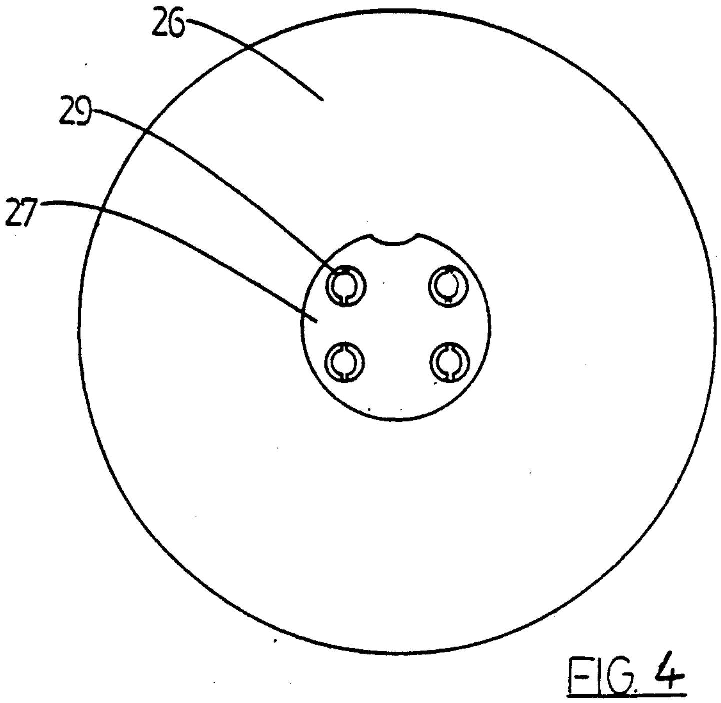
FIG. 4. is a sketch of the unit from the rear showing terminals for connection into an outlet.

A cluster of LEDs 20 is set on a circuit board 22. For display signs for written information, the LEDs 20 are suitably mixed red and yellow LEDs, the red and yellow LEDs having their own connections to supply circuit for electricity. One suitable pattern of red and Yellow LEDs 20 is shown in FIG. 3. Suitable series resistors may be provided to guard against overloading the LEDs.

The circuit board 22 with its cluster of LEDs 20 is connected with wiring 24 for both red and yellow LEDs to socket connections of a generally cylindrical housing 26 for the LED cluster. The housing 26 is open to one side and is provided with a projection 27 housing socket electrical sockets 29 for pins 30 of the connector member 16. Suitably four such sockets 29 may be provided as seen in FIG. 6. The circuit board 22 fits into the housinq 26 and is set therein in potting compound 28 so that the cluster of LEDs project towards the front of the housing. Thus, potting compound 28 may both firmly set the LEDs in position and seal them into the housing so that the arrangement may be water-tight. The top domes of the LEDs 20 project from the potting compound 28 to provide light at the front opening of the housing 26.

The housing 26 may suitably be of circular section to receive a circular cluster of LEDs but other shapes are possible. An arrangement of circular clusters (FIG. 3) is especially useful for highway text displays where light bleed between pixels is of concern.

The housing 26 rests slidably in connector member 16 with pins 30 of the connector member in electrical contact in socket connections 29 of housing 26. As shown, there are four pins 30, each mating with a socket 29. Two of these pins are provided to connect wiring the red LEDs and two of them are provided to connect wiring to the yellow LEDs. However, it will be appreciated that an infinite variety of colour patterns are possible and it is not necessary to provide two different colours of LEDs in a unit 10; either less or more colours are possible.

The connecting socket member 16 comprises a socket of similar cross-section to that of the cluster member 14, and pins 30 for mating with sockets 29.

The connecting socket member 16 may be useful to provide directionality to the housing 26 and to protect the circuit board in housing 26 from any torque during connection of the unit into the main display board. By the use of a connecting socket 16, driver circuitry may be mounted directly behind the connector socket, thus saving space and the cost of separate driver circuits. Moreover, the arrangement may provide protection of driver circuits from ultraviolet rays.

To aid weather proofing, each housing 26 may be provided with at least one peripheral groove for a sealing ring 32. As shown, two sealing rings 32 are provided. These rings 32 may seal with the interior of connecting socket member 16.

Conveniently, sockets 29 are provided in a projection 27 from the back of housing 26 which projection fits into a corresponding recess 34 of connector member 16, which recess houses pins 30. While the projection 27 and recess 34 are shown as having circular cross-sections, there is no reason why they should not be of other shapes, e.g., triangular or hexagonal, to aid proper location of pins 30 in sockets 29. Alternatively, a locating rib and groove may be provided on respective ones of the projection 36 and recess 34.

Plug member 38 is provided on the back of connecting socket 16 for direct connection into a display sign having suitable electric power supply to power the LEDs, and within the socket 16 connector means are provided for the sockets 29 of the cluster member 14.

The arrangement as so far described may be advantageous in that it is inexpensively and easily assembled without the need for encapsulating the LED clusters in a frangible glass bulb. The resultant combination of LED cluster member 14 and connector socket member 16 is robust and the cushioning of the LEDs in waterproof potting compound may provide protection for the LEDs resulting in long life and little or no maintenance. Moreover, the arrangement may be subject to reduced tendency to be obscured by glare of reflected light, such as sunlight, therefrom. Also pulse width modulation can be used to infinitely vary the light output level of the cluster to match the ambient light levels.

The provision of visor 12 may provide several additional advantages, in that visor 12 covers connector member 16 and may contribute to protecting it from dust, dirt and exhaust fumes. However, the intended function of visor 12 is to shield the LED cluster from sunlight and from laterally incident light. Thus the visor acts to focus the light output towards the viewer. For example, in the highway application it is important the motorists in peripheral traffic lanes do not read messages which do not apply to them. The visor also prevents light bleed between pixels which ensures proper definition of each character.

Each visor 12 comprises a tube, one end portion of which fits slidably over connecting member 16 and is aligned axially with it. Stops 40 may be provided on member 16 for visor 12 to determine its final position or member 16. The visor 12 is considerably longer in its axial dimension than cluster member 14 and connector member 16 and is suitably made from dark coloured plastic with a matte surface. Moreover, the visor 12 may be shaped at its front end to form an upper hood portion 42 and a lower cut away portion 44.

The upper hood portion 42 may act as additional protection from overhead light and lower cut away portion 44 may aid vision of the display via tubular visor 12.

The visor 12 may suitably be between 2 inches to 12 inches in length for example it may be more than 4 inches at its cut away portion 44 and more than 8 inches at its hood portion 42. The combination of the LED cluster member 14 nested within the connector member 16 may have a length of around 1 inch. Thus, the visor member may suitably be around ten times as long as the LED cluster in its connecting member. Suitably a rib and groove or other locating means may be provided to locate the hood in an upper position. Because the visor is a simple tube easily slidable onto the connector member, it is easily replaceable when required. It may be made to be robust to withstand breakage and deterioration due to environmental conditions. However, a housing for a cluster of light emitting diodes slidably nested within said connector socket and being an open-fronted socket having electrical connection means extending light emitting diodes through a near wall to second electric contacts adapted to connect with said first electric contacts of said connector socket, positioned on a circuit board and being housing embedded in potting compound within the socket light emitting domes of the light emitting diodes projecting from a front surface of the potting compound, a connector socket for said housing for connection into an electrically operated display; and in the event, over a long term, if deterioration does occur, the visor is inexpensive.

Figure 5:
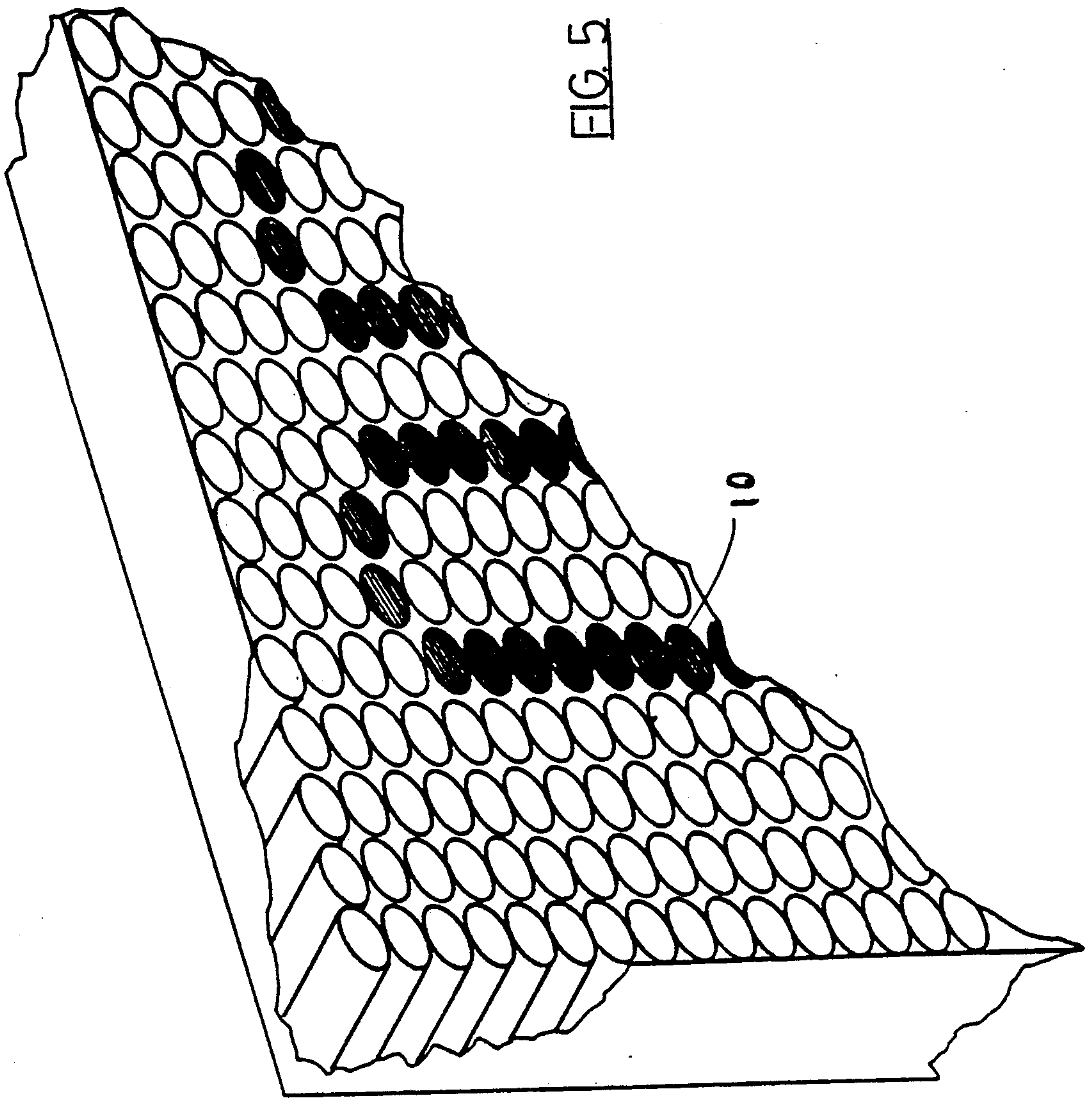
FIG. 5 is a sketch of a display sign according to the invention comprising LED units.

FIG. 5 is a sketch giving a general indication of the use of units 10 in display sign. Suitably each unit 10 forms an integer of each letter or other symbol of the sign. However, in the event of component failure, it is unlikely that all the LEDs of a unit will fail together. Thus, in the event of component failure, letter or symbol definition may be improved over the case where a single incandescent unit is used for a similar integer.

We claim:

1. A light emitting diode cluster unit for outdoor use comprising:

a connector socket for direct connection into an electrical outlet of an electrically operated display outlet, the connector socket comprising a connector sleeve closed at a rear end by a connector rear wall, first electrical contacts being located within the connector socket, and first electrical connectors passing through the connector rear wall for connection into said outlet;

a housing socket for housing a cluster of light emitting diodes, the housing socket comprising a housing sleeve closed at a rear end by a housing rear wall, second electrical contacts being located within the housing socket, and second electrical connectors passing through the housing rear wall adapted for connection to said first electrical contacts;

a circuit board including a plurality of light emitting diodes on one face of said circuit board and connected to said second electrical contacts, the circuit board being located within the housing socket substantially parallel to the housing rear wall;

a layer of potting compound for sealing the circuit board in position and sealingly embedding the light emitting diodes such that at least a portion of the light omitting diodes project forwardly out of the potting compound; and weather sealing means arranged between the connector sleeve and the housing sleeve in sealing contact with both said sleeves for substantially preventing the intrusion of undesirable elements beyond said weather sealing means;

wherein the housing socket is slidably and substantially fully nested within the connector socket by slidable engagement of the housing sleeve within the connector sleeve.

2. A unit as claimed in claim 1 including a generally tubular visor extending forwardly of the connector socket.

3. A unit as claimed in claim 2 in which the visor includes an upper hood portion extending further forwardly of a main visor portion.

4. A unit as claimed in claim 2 in which the visor extends forwardly of the light emitting diode cluster by between 2 inches and 12 inches.

5. A unit as claimed in claim 1 in which the light emitting diode cluster includes a first plurality of light emitting diodes for emitting one colour of light and a second plurality of light emitting diodes for emitting another colour of light.

6. An electrical display sign having electrical outlets for a plurality of light emitting diode units, including light emitting diodes connected into said outlets, each light emitting diode unit comprising:

a connector socket including a connector sleeve closed at a rear end by a connector rear wall, first electrical contacts being located within the connector socket, and first electrical connectors passing through the connector rear wall for connection into said outlet;

a housing socket for housing a cluster of light emitting diodes, the housing socket comprising a housing sleeve closed at a rear end by a housing rear wall, second electrical contacts being located within the housing socket, and second electrical connectors passing through the housing rear wall adapted for connection to said first electrical contacts;

a circuit board including a plurality of light emitting diodes on one face of said circuit board and connected to said second electrical contacts, the circuit board being located within the housing socket substantially parallel to the housing rear wall;

a layer of potting compound for sealing the circuit board in position and sealingly embedding the light emitting diodes such that at least a portion of the light emitting diodes project forwardly out of the potting compound; and weather sealing means arranged between the connector sleeve and the housing sleeve in sealing contact with both said sleeves for substantially preventing the intrusion of undesirable elements beyond said weather sealing means;

wherein the housing socket is slidably and substantially fully nested with the connector socket by slidable engagement of the housing sleeve within the connector sleeve.

7. An electrical display sign as claimed in claim 6 including a generally tubular visor extending forwardly of the connector socket.

* * * * *